United States Patent
Sakuma et al.

(10) Patent No.: US 10,790,434 B2
(45) Date of Patent: Sep. 29, 2020

(54) PIEZOELECTRIC THIN FILM-STACKED BODY, PIEZOELECTRIC THIN FILM SUBSTRATE, PIEZOELECTRIC THIN FILM DEVICE, PIEZOELECTRIC ACTUATOR, PIEZOELECTRIC SENSOR, HEAD ASSEMBLY, HEAD STACK ASSEMBLY, HARD DISK DRIVE, PRINTER HEAD, AND INK-JET PRINTER DEVICE

(71) Applicant: TDK CORPORATION, Tokyo (JP)

(72) Inventors: Hitoshi Sakuma, Tokyo (JP); Tomohisa Azuma, Tokyo (JP); Kenta Ishii, Tokyo (JP)

(73) Assignee: TDK CORPORATION, Tokyo (JP)

( * ) Notice: Subject to any disclaimer, the term of this patent is extended or adjusted under 35 U.S.C. 154(b) by 470 days.

(21) Appl. No.: 15/831,630

(22) Filed: Dec. 5, 2017

(65) Prior Publication Data
US 2018/0159020 A1    Jun. 7, 2018

(30) Foreign Application Priority Data

Dec. 7, 2016   (JP) .................................. 2016-237725

(51) Int. Cl.
*H01L 41/083*     (2006.01)
*H01L 41/08*      (2006.01)
(Continued)

(52) U.S. Cl.
CPC ...... *H01L 41/0815* (2013.01); *B41J 2/14201* (2013.01); *B41J 2/14233* (2013.01);
(Continued)

(58) Field of Classification Search
CPC .............. H01L 41/0805; H01L 41/0815; B41J 2/14201; B41J 2002/14258
See application file for complete search history.

(56) References Cited

U.S. PATENT DOCUMENTS

| 6,347,862 B1 | 2/2002 | Kanno et al. |
| 2003/0076007 A1* | 4/2003 | Murai ................... B41J 2/1628 310/324 |

(Continued)

FOREIGN PATENT DOCUMENTS

| JP | H10-286953 A | 10/1998 |
| JP | 2007-19302 A | 1/2007 |

(Continued)

OTHER PUBLICATIONS

Hideya Yamadera, "Measurement and Control of Thermal Stress in Thin Films", R&D Review of Toyota CRDL, vol. 34, No. 1, 1999.3, vol. 34, No. 1, p. 19-p. 24.

*Primary Examiner* — Jaydi San Martin
(74) *Attorney, Agent, or Firm* — Oliff PLC

(57) ABSTRACT

A piezoelectric thin film-stacked body is provided. A piezoelectric thin film-stacked body has a first electrode layer, a first oxide layer stacked on the first electrode layer, a second oxide layer stacked on the first oxide layer, and a piezoelectric thin film stacked on the second oxide layer, the electrical resistivity of the first oxide layer is higher than the electrical resistivity of the second oxide layer, the first oxide layer includes K, Na, and Nb, and the piezoelectric thin film includes $(K,Na)NbO_3$.

12 Claims, 10 Drawing Sheets

(51) Int. Cl.
   B41J 2/14      (2006.01)
   H01L 41/187    (2006.01)
   H01L 41/047    (2006.01)
   H01L 41/18     (2006.01)
   *G11B 21/10*       (2006.01)
   *H01L 41/09*       (2006.01)
   *H01L 41/316*      (2013.01)
   *G11B 5/48*        (2006.01)
   *H01L 41/113*      (2006.01)

(52) U.S. Cl.
   CPC .......... H01L 41/0477 (2013.01); H01L 41/18 (2013.01); H01L 41/1873 (2013.01); *B41J 2202/03* (2013.01); *G11B 5/483* (2015.09); *G11B 21/10* (2013.01); *H01L 41/094* (2013.01); *H01L 41/0973* (2013.01); *H01L 41/1132* (2013.01); *H01L 41/316* (2013.01)

(56) References Cited

U.S. PATENT DOCUMENTS

| | | |
|---|---|---|
| 2009/0026887 A1 | 1/2009 | Fujii et al. |
| 2009/0075066 A1 | 3/2009 | Shibata et al. |
| 2013/0127293 A1 | 5/2013 | Ikeuchi et al. |
| 2014/0035439 A1* | 2/2014 | Kurachi .............. H01L 41/0477 310/364 |
| 2014/0049138 A1* | 2/2014 | Shiraki ............... C23C 18/1216 310/330 |
| 2014/0339961 A1 | 11/2014 | Maejima et al. |
| 2015/0194592 A1 | 7/2015 | Aida et al. |
| 2016/0365503 A1* | 12/2016 | Ikeuchi ................. C04B 35/465 |
| 2019/0275545 A1* | 9/2019 | Mizukami .............. B41J 2/1607 |
| 2020/0001327 A1* | 1/2020 | Le Rhun ........... H01L 27/11507 |
| 2020/0013852 A1* | 1/2020 | Le Rhun ............. H01L 21/6835 |

FOREIGN PATENT DOCUMENTS

| | | |
|---|---|---|
| JP | 2009-094449 A | 4/2009 |
| JP | 2009-130182 A | 6/2009 |
| JP | 2014-229902 A | 12/2014 |
| WO | 2012/020638 A1 | 2/2012 |

\* cited by examiner

PIEZOELECTRIC THIN FILM-STACKED BODY, PIEZOELECTRIC THIN FILM SUBSTRATE, PIEZOELECTRIC THIN FILM DEVICE, PIEZOELECTRIC ACTUATOR, PIEZOELECTRIC SENSOR, HEAD ASSEMBLY, HEAD STACK ASSEMBLY, HARD DISK DRIVE, PRINTER HEAD, AND INK-JET PRINTER DEVICE

TECHNICAL FIELD

The present invention relates to a piezoelectric thin film-stacked body, a piezoelectric thin film substrate, a piezoelectric thin film device, a piezoelectric actuator, a piezoelectric sensor, a head assembly, a head stack assembly, a hard disk drive, a printer head, and an ink-jet printer device.

BACKGROUND

In recent years, piezoelectric thin film devices using piezoelectric thin films have been progressing toward practical application instead of bulk piezoelectric materials. In piezoelectric sensors in which a positive piezoelectric effect is utilized, force applied to piezoelectric thin films is converted into voltage. Piezoelectric sensors are, for example, gyro sensors, pressure sensors, pulse wave sensors, shock sensors, microphones, and the like. Meanwhile, in piezoelectric actuators in which an inverse piezoelectric effect is utilized, when voltage is applied to piezoelectric thin films, the piezoelectric thin films deform. Piezoelectric actuators are, for example, hard disk drive head assemblies, ink-jet print heads, speakers, buzzers, resonators, and the like.

The fabrication of piezoelectric materials into thin films enables miniaturizing piezoelectric thin film devices and broadens the field to which piezoelectric thin film devices are applicable. Since many piezoelectric thin film devices can be collectively produced on a substrate by fabricating piezoelectric materials into thin films, the productivity is increased. The performance such as the sensitivity of piezoelectric sensors is improved by fabricating piezoelectric materials into thin films.

Methods for forming piezoelectric thin films are a sputtering method, a chemical vapor deposition (CVD) method, and the like. However, in the process of forming piezoelectric thin films, defects may occur in the piezoelectric thin films. Defects may also occur in the piezoelectric thin films due to various factors on the joining interface between a piezoelectric thin film and a different type of material. Due to these defects, the crystalline state of a piezoelectric thin film is deteriorated, and a portion having low electric resistance may be produced in a piezoelectric thin film.

Lead zirconate titanate (PZT: $Pb(Zr,Ti)O_3$) has been used as piezoelectric thin films until now. However, materials not including lead have been required in view of the environment in recent years. A material containing potassium sodium niobate (KNN: $(K,Na)NbO_3$) as a main ingredient is disclosed as a piezoelectric material not including lead in Japanese Unexamined Patent Publication No. 2009-130182.

SUMMARY

Problem to be Solved by the Invention

It is disclosed in Japanese Unexamined Patent Publication No. 2009-130182 that a piezoelectric thin film device comprises a current block layer between a piezoelectric thin film and an upper electrode layer, the electric resistance value between electrodes is secured thereby, and the leakage current in a piezoelectric thin film device can be reduced.

However, although an electric resistance value is secured in a piezoelectric thin film device described in Japanese Unexamined Patent Publication No. 2009-130182, an effective voltage applied to the piezoelectric thin film decreases, and sufficient piezoelectric characteristics may not be able to be obtained. When conventional piezoelectric thin film devices have been operated continuously for a long period, the piezoelectric constants of the piezoelectric thin film devices decrease easily.

The present invention has been completed in light of the above-mentioned circumstances, and an object thereof is to provide a piezoelectric thin film-stacked body the electrical resistivity of which is high and the piezoelectric constants of which are unlikely to decrease in spite of a continuous operation, a piezoelectric thin film substrate, and a piezoelectric thin film device as well as a piezoelectric actuator using the piezoelectric thin film device, a piezoelectric sensor, a head assembly, a head stack assembly, a hard disk drive, a printer head, and an ink-jet printer device.

Means for Solving the Problem

A piezoelectric thin film-stacked body according to one aspect of the present invention comprises a first electrode layer, a first oxide layer stacked on the first electrode layer, a second oxide layer stacked on the first oxide layer, and a piezoelectric thin film stacked on the second oxide layer, the electrical resistivity of the first oxide layer is higher than the electrical resistivity of the second oxide layer, the first oxide layer includes K, Na, and Nb, and the piezoelectric thin film includes $(K,Na)NbO_3$.

The electrical resistivity of the above-mentioned piezoelectric thin film-stacked body according to one aspect of the present invention may be $1.0 \times 10^{11}$ to $1.0 \times 10^{14}$ Ωcm.

In the above-mentioned piezoelectric thin film-stacked body according to one aspect of the present invention, the ratio $T_1/T_P$ of the thickness $T_1$ of the first oxide layer to the thickness $T_P$ of the piezoelectric thin film may be 0.0010 to 0.0150.

A piezoelectric thin film substrate according to one aspect of the present invention includes the above-mentioned piezoelectric thin film-stacked body and a substrate, and the first electrode layer is located between the substrate and the first oxide layer.

A piezoelectric thin film device according to one aspect of the present invention includes the above-mentioned piezoelectric thin film-stacked body and a second electrode layer, and the first oxide layer, the second oxide layer, and the piezoelectric thin film are located between the first electrode layer and the second electrode layer.

A piezoelectric actuator according to one aspect of the present invention comprises the above-mentioned piezoelectric thin film device.

A piezoelectric sensor according to one aspect of the present invention comprises the above-mentioned piezoelectric thin film device.

A head assembly according to one aspect of the present invention comprises the above-mentioned piezoelectric actuator.

A head stack assembly according to one aspect of the present invention comprises the above-mentioned head assembly.

A hard disk drive according to one aspect of the present invention comprises the above-mentioned head stack assembly.

A printer head according to one aspect of the present invention comprises the above-mentioned piezoelectric actuator.

An ink-jet printer device according to one aspect of the present invention comprises the above-mentioned printer head.

Effects of Invention

The present invention provides a piezoelectric thin film-stacked body the electrical resistivity of which is high and the piezoelectric constants of which are unlikely to decrease in spite of a continuous operation, a piezoelectric thin film substrate, and a piezoelectric thin film device as well as a piezoelectric actuator using the piezoelectric thin film device, a piezoelectric sensor, a head assembly, a head stack assembly, a hard disk drive, a printer head, and an ink-jet printer device.

DETAILED DESCRIPTION

Figure 1A:
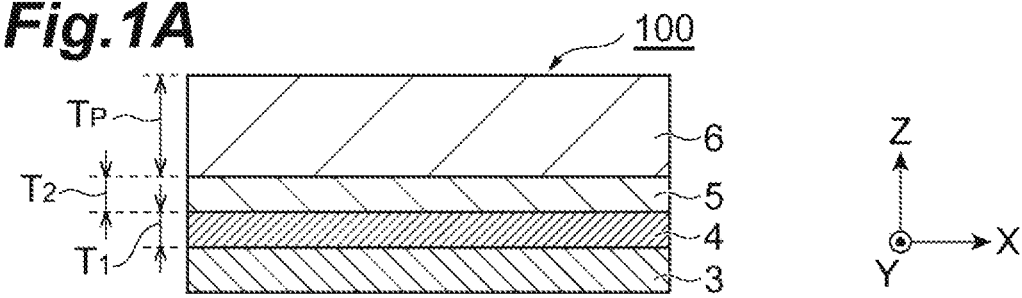
FIG. 1A is a schematic view of a piezoelectric thin film-stacked body according to one embodiment of the present invention (a sectional view of the piezoelectric thin film-stacked body in the stacking direction)

One preferred embodiment of the present invention will be described in detail hereinafter with reference to the drawings. In the drawings, identical or equivalent components are marked with the same reference sign. X, Y, and Z illustrated in FIGS. 1A, 1B, 1C, 1D, and 10 mean three coordinate axes at right angles to one another. When a description overlaps, the description is omitted. The present invention is not limited to the following embodiments.

(Piezoelectric Thin Film-Stacked Body, Piezoelectric Thin Film Substrate, and Piezoelectric Thin Film Device)

As illustrated in FIG. 1A, a piezoelectric thin film-stacked body 100 according to this embodiment comprises a first electrode layer 3, a first oxide layer 4 stacked on the surface of the first electrode layer 3, a second oxide layer 5 stacked on the surface of the first oxide layer 4, and a piezoelectric thin film 6 stacked on the surface of the second oxide layer 5. That is, part or all of the first oxide layer 4 overlaps the surface of the first electrode layer 3, part or all of the second oxide layer 5 overlaps the surface of the first oxide layer 4, and part or all of the piezoelectric thin film 6 overlaps the surface of the second oxide layer 5. The electrical resistivity of the first oxide layer 4 is higher than the electrical resistivity of the second oxide layer 5. The first oxide layer 4 includes K, Na, and Nb. The piezoelectric thin film 6 includes $(K,Na)NbO_3$.

Figure 1B:
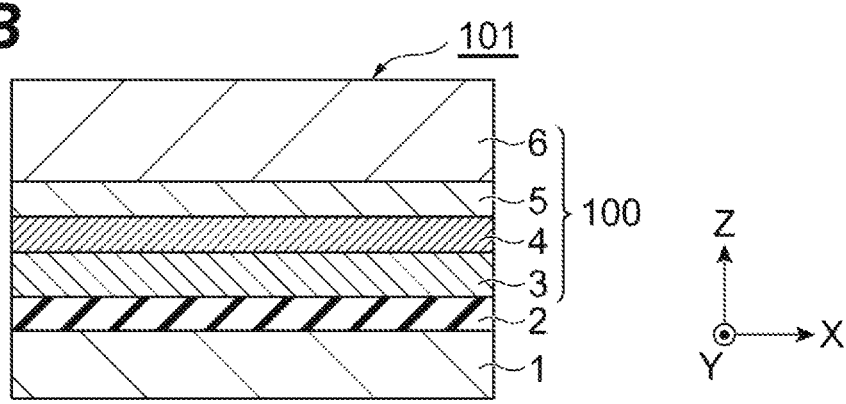
FIG. 1B is a schematic view of a piezoelectric thin film substrate according to one embodiment of the present invention (a sectional view of the piezoelectric thin film substrate in the stacking direction)

As illustrated in FIG. 1B, a piezoelectric thin film substrate 101 according to this embodiment includes a substrate 1, an insulating layer 2, and the above-mentioned piezoelectric thin film-stacked body 100. The first electrode layer 3 is located between the substrate 1 and the first oxide layer 4. The insulating layer 2 is stacked on the surface of the substrate 1. The first electrode layer 3 is stacked on the surface of the insulating layer 2. Part or all of the insulating layer 2 may overlap the surface of the substrate 1. Part or all of the first electrode layer 3 may overlap the surface of the insulating layer 2. The piezoelectric thin film substrate 101 may not comprise the insulating layer 2. When there is no insulating layer 2, the substrate 1 may be in contact with the surface of the first electrode layer 3. The piezoelectric thin film substrate 101 may not be divided to be individual pieces (for example, a wafer). The piezoelectric thin film substrate 101 may be divided into individual pieces (for example, chips).

Figure 1C:
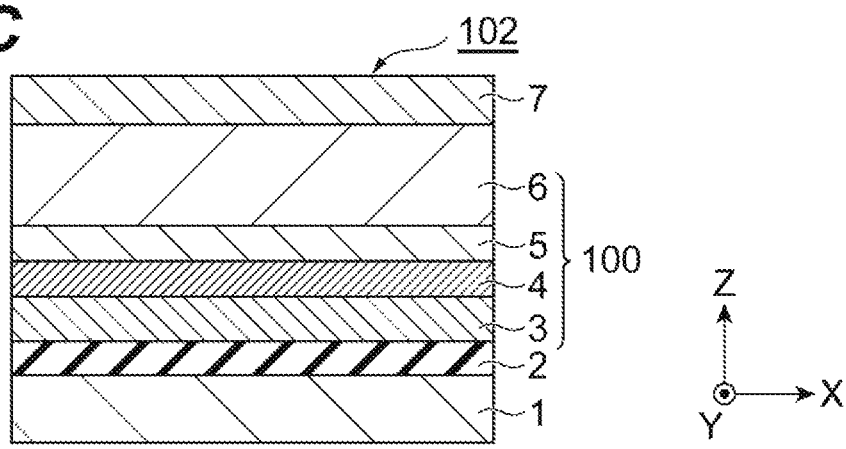
FIG. 1C is a schematic view of a piezoelectric thin film device according to one embodiment of the present invention (a sectional view of the piezoelectric thin film device in the stacking direction)

As illustrated in FIG. 1C, a piezoelectric thin film device 102 according to this embodiment includes the substrate 1, the insulating layer 2, the above-mentioned piezoelectric thin film-stacked body 100, and a second electrode layer 7. In other words, the piezoelectric thin film device 102 includes the above-mentioned piezoelectric thin film substrate 101 and the second electrode layer 7. The first oxide layer 4, the second oxide layer 5, and the piezoelectric thin film 6 are located between the first electrode layer 3 and the second electrode layer 7. The second electrode layer 7 is stacked on the surface of the piezoelectric thin film 6. Part or all of the second electrode layer 7 may overlap the surface of the piezoelectric thin film 6. The piezoelectric thin film device 102 may not comprise the substrate 1. The piezoelectric thin film device 102 may not comprise the insulating layer 2.

Figure 1D:
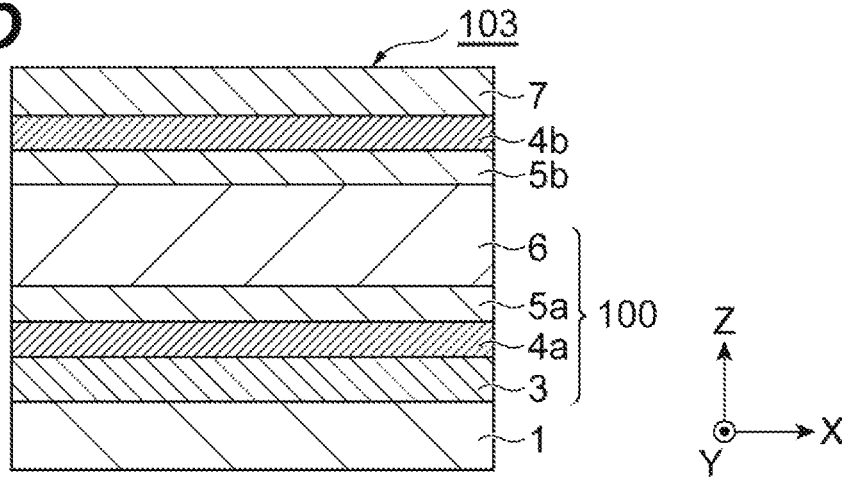
FIG. 1D is a schematic view of a piezoelectric thin film device according to one embodiment of the present invention (a sectional view of the piezoelectric thin film device in the stacking direction).

As illustrated in FIG. 1D, a piezoelectric thin film device 103, which is a variation of the piezoelectric thin film device 102, includes the substrate 1, the above-mentioned piezoelectric thin film-stacked body 100, a different second oxide layer 5b from a second oxide layer 5a that the piezoelectric thin film-stacked body 100 comprises, a different first oxide layer 4b from a first oxide layer 4a that the piezoelectric thin film-stacked body 100 comprises, and the second electrode layer 7. The different second oxide layer 5b is stacked on the surface of the piezoelectric thin film 6. The different first oxide layer 4b is stacked on the surface of the different second oxide layer 5b. The second electrode layer 7 is stacked on the surface of the different first oxide layer 4b. Part or all of the different second oxide layer 5b may overlap the surface of the piezoelectric thin film 6. Part or all of the different first oxide layer 4b may overlap the surface of the different second oxide layer 5b. Part or all of the second electrode layer 7 may overlap the surface of the different first oxide layer 4b. The piezoelectric thin film device 103 may not comprise the substrate 1. The piezoelectric thin film device 103 may comprise the insulating layer 2.

The electrical resistivity of the piezoelectric thin film-stacked body 100 may be the total of the electrical resistivity of the first oxide layer 4, the second oxide layer 5, and the piezoelectric thin film 6 in the stacking direction of the piezoelectric thin film-stacked body 100. The electrical resistivity of the piezoelectric thin film-stacked body 100 is higher than the electrical resistivity of conventional piezoelectric thin film-stacked bodies using KNN. Even though the piezoelectric thin film-stacked body 100 has been operated continuously, the piezoelectric constant of the piezoelectric thin film-stacked body 100 does not decrease as easily as conventional piezoelectric thin film-stacked bodies using KNN. The electrical resistivity of the piezoelectric thin film substrate 101 may be the total of the electrical resistivity of the first oxide layer 4, the second oxide layer 5, and the piezoelectric thin film 6 in the stacking direction of the piezoelectric thin film substrate 101. The electrical resistivity of the piezoelectric thin film substrate 101 is higher than the electrical resistivity of conventional piezoelectric thin film substrates using KNN. Even though the piezoelectric thin film substrate 101 has been operated continuously, the piezoelectric constant of the piezoelectric thin film substrate 101 does not decrease as easily as conventional piezoelectric thin film substrates using KNN. The electrical resistivity of the piezoelectric thin film devices 102 and 103 may be the electrical resistivity between the first electrode layer 3 and the second electrode layer 7 in the stacking direction of the piezoelectric thin film devices 102 and 103. That is, the electrical resistivity of the piezoelectric thin film device 102 may be the total of the electrical resistivity of the first oxide layer 4, the second oxide layer 5, and the piezoelectric thin film 6 in the stacking direction of the piezoelectric thin film device 102. The electrical resistivity of the piezoelectric thin film device 103 may be the total of the electrical resistivity of the first oxide layer 4a, the second oxide layer 5a, the piezoelectric thin film 6, the second oxide layer 5b, and the first oxide layer 4b in the stacking direction of the piezoelectric thin film device 103. The electrical resistivity of the piezoelectric thin film devices 102 and 103 is higher than the electrical resistivity of conventional piezoelectric thin film devices using KNN. Even though the piezoelectric thin film devices 102 and 103 have been operated continuously, the piezoelectric constants of the piezoelectric thin film devices 102 and 103 do not decrease as easily as conventional piezoelectric thin film devices using KNN.

The present inventors consider that the reasons why the electrical resistivity of the piezoelectric thin film-stacked body 100 is high and the piezoelectric constant of the piezoelectric thin film-stacked body 100 is unlikely to decrease are as follows. The piezoelectric thin film-stacked body 100 comprises the first oxide layer 4 and the second oxide layer 5. Therefore, the electrical resistivity of the piezoelectric thin film-stacked body 100 becomes higher than conventional piezoelectric thin film-stacked bodies that do not comprise the first oxide layer 4 and the second oxide layer 5. A gap of the physical properties between the second oxide layer 5 and the piezoelectric thin film 6 is reduced by providing the first oxide layer 4 including K, Na, and Nb that are the same as elements contained in the piezoelectric thin film 6 ((K,Na)NbO$_3$). The physical properties are, for example, a coefficient of linear expansion and the like. The gap of physical properties is reduced, so that the piezoelectric constant comes to be unlikely to decrease even though the piezoelectric thin film-stacked body 100 has been operated continuously. However, the effective voltage applied to the piezoelectric thin film 6 decreases easily when there is only the first oxide layer 4. However, a decrease in an effective voltage applied to the piezoelectric thin film 6 is suppressed by providing the second oxide layer 5 that has the electrical resistivity lower than the electrical resistivity of the first oxide layer 4. The reasons why the electrical resistivity of the piezoelectric thin film-stacked body 100 is high and the piezoelectric constant of the piezoelectric thin film-stacked body 100 is unlikely to decrease are not limited to the above-mentioned reasons.

The electrical resistivity of the piezoelectric thin film-stacked body 100 may be $1.0 \times 10^{11}$ to $1.0 \times 10^{14}$ Ωm or $9.80 \times 10^{11}$ to $6.30 \times 10^{13}$ Ωcm. When the electrical resistivity of the piezoelectric thin film-stacked body 100 is $1.0 \times 10^{11}$ Ωcm or more, a voltage applied to the piezoelectric thin film-stacked body 100 is easily converted into piezoelectric characteristics, and sufficient piezoelectric characteristics are easily obtained. That is, when the electrical resistivity of the piezoelectric thin film-stacked body 100 is $1.0 \times 10^{11}$ Ωcm or more, an inverse piezoelectric effect is easily caused by an applied voltage. When the electrical resistivity of the piezoelectric thin film-stacked body 100 is $1.0 \times 10^{14}$ Ωcm or less, lower heat is generated from the piezoelectric thin film-stacked body 100, and a decrease in the piezoelectric constant resulting from the deterioration of the piezoelectric thin film 6 due to the influence of heat is unlikely to occur.

The ratio $T_1/T_P$ of the thickness $T_1$ of the first oxide layer 4 to the thickness $T_P$ of the piezoelectric thin film 6 may be 0.0010 to 0.0150. When $T_1/T_P$ is in the above-mentioned range, the electrical resistivity of the piezoelectric thin film-stacked body 100 becomes high easily. Since a decrease in an effective voltage applied to the piezoelectric thin film 6 is suppressed more easily, the piezoelectric constant of the piezoelectric thin film-stacked body 100 is unlikely to decrease even though the piezoelectric thin film-stacked body 100 has been operated continuously. When $T_1/T_P$ is less than 0.0010, the state of the first oxide layer 4 changes easily due to the influence of the formation of the second oxide layer 5. Consequently, the state of the piezoelectric thin film 6 changes easily, and the piezoelectric characteristics may be unlikely to improve. When $T_1/T_P$ is more than 0.0150, the electrical resistivity of the first oxide layer 4 becomes high easily, and an effective voltage applied to the piezoelectric thin film 6 decreases easily, and therefore, the piezoelectric constant of the piezoelectric thin film-stacked body 100 may decrease easily.

The substrate 1 may be, for example, a silicon substrate (for example, a single crystal silicon substrate), an SOI (Silicon on Insulator) substrate, a quartz glass substrate, a compound semiconductor substrate consisting of GaAs or the like, a sapphire substrate, a metallic substrate consisting of stainless steel or the like, a MgO substrate, a SrTiO$_3$ substrate, or the like. A silicon substrate is preferable as the substrate 1 in view of a low cost and ease of handling. When the substrate 1 is a silicon substrate, the plane direction of the surface of the substrate 1 with which the insulating layer 2 or the first electrode layer 3 overlaps may be (100), and may be a plane direction different from (100). The thickness of the substrate 1 may be, for example, 10 to 1000 μm.

The insulating layer 2 insulates electrically between the substrate 1 and the first electrode layer 3. When the substrate 1 does not have conductivity, the piezoelectric thin film substrate 101 or the piezoelectric thin film device 102 may not comprise the insulating layer 2. When the substrate 1 has conductivity, the piezoelectric thin film device 103 may comprise the insulating layer 2. The insulating layer 2 may be, for example, the thermal oxide film of silicon ($SiO_2$), $Si_3N_4$, $ZrO_2$, $Y_2O_3$, ZnO, $Al_2O_3$, or the like. Methods for forming the insulating layer 2 may be a sputtering method, a vacuum deposition method, a thermal oxidation method, a printing method, a spin coating method, a sol-gel method, and the like. The thickness of the insulating layer 2 may be, for example, 10 to 1000 nm.

The first electrode layer 3 may consist of at least one metal selected from the group consisting of, for example, Pt (platinum), Pd (palladium), Rh (rhodium), Au (gold), Ru (ruthenium), Ir (iridium), Mo (molybdenum), Ti (titanium), Ta (tantalum), and Ni (nickel). The first electrode layer 3 may consist of, for example, a conductive metallic oxide such as $SrRuO_3$ (strontium ruthenate) or $LaNiO_3$ (lanthanum nickelate). The first electrode layer 3 may function as a substrate. When the first electrode layer 3 functions as a substrate, the piezoelectric thin film devices 102 and 103 may not comprise the substrate 1. The thickness of the first electrode layer 3 may be, for example, 20 to 1000 nm. When the thickness of the first electrode layer 3 is 20 nm or more, the function of the first electrode layer 3 becomes enough easily. When the thickness of the first electrode layer 3 is 1000 nm or less, the displacement characteristics of the piezoelectric thin film 6 are improved easily.

Methods for forming the first electrode layer 3 may be, for example, a sputtering method, a vacuum deposition method, a printing method, a spin coating method, a sol-gel method, and the like. When the first electrode layer 3 is formed by a sputtering method, the first electrode layer 3 may be formed in an Ar (argon) gas. The gas pressure may be 0.1 to 1.0 Pa. An applying power source may be a high-frequency power source or a direct-current power source. The output of an applying power source may be 0.5 to 1.0 W/$cm^2$. When the substrate 1 is a silicon substrate and the first electrode layer 3 is a Pt film, the Pt film is formed on a surface ((100) plane) of the silicon substrate heated at around 400 to 500° C. by a sputtering method.

The electrical resistivity of the first oxide layer 4 is higher than the electrical resistivity of the second oxide layer 5. The electrical resistivity of the first oxide layer 4 may be equal to or higher than the electrical resistivity of the piezoelectric thin film 6. The electrical resistivity of the first oxide layer 4 may be, for example, $1.0 \times 10^{12}$ to $1.0 \times 10^{15} \Omega cm$. When the electrical resistivity of the first oxide layer 4 is $1.0 \times 10^{12} \Omega cm$ or more, the electrical resistivity of the piezoelectric thin film-stacked body 100 becomes higher easily, and even though the piezoelectric thin film-stacked body 100 has been operated continuously, the piezoelectric constant is more unlikely to decrease. When the electrical resistivity of the first oxide layer 4 is $1.0 \times 10^{15} \Omega cm$ or less, the heat generation of the piezoelectric thin film 6 is suppressed, and a decrease in the piezoelectric constant due to the deterioration of the piezoelectric thin film 6 is unlikely to occur.

The first oxide layer 4 includes K, Na, and Nb. The first oxide layer 4 may consist of an oxide including K, Na, and Nb. The first oxide layer 4 may further include other elements in addition to K, Na, and Nb. The other elements may be, for example, Li (lithium), Ba (barium), Sr (strontium), Ta (tantalum), Zr (zirconium), Mn (manganese), Sb (antimony), Ca (calcium), Cu (copper), and the like. When the first oxide layer 4 includes other elements, the total of the content of K, Na, and Nb in the first oxide layer 4 may be 80 mol % or more. In the piezoelectric thin film device 103, the composition of the first oxide layer 4a may be the same as the composition of the different first oxide layer 4b, and may be different from the composition of the different first oxide layer 4b. The thickness $T_1$ of the first oxide layer 4 may be, for example, 3 to 100 nm. The thickness of the first oxide layer 4a may be the same as the thickness of the different first oxide layer 4b, and may be different from the thickness of the different first oxide layer 4b.

Methods for forming the first oxide layer 4 may be, for example, a sputtering method. When the first oxide layer 4 is formed by a sputtering method, the first oxide layer 4 may be formed in a mixed gas of Ar and $O_2$ (oxygen). A sputtering target includes K, Na, and Nb. A sputtering target may include $(K,Na)NbO_3$. The same sputtering target as the sputtering target used for forming the piezoelectric thin film 6 may be used as a sputtering target. The molar ratio between K and Na in a sputtering target for the first oxide layer 4 may be the same as the molar ratio of K and Na in a sputtering target for the piezoelectric thin film 6. The molar ratio between K and Na in a sputtering target for the first oxide layer 4 may be different from the molar ratio between K and Na in a sputtering target for the piezoelectric thin film 6. An applying power source may be a high-frequency power source.

The electrical resistivity of the second oxide layer 5 is lower than the electrical resistivity of the first oxide layer 4. The electrical resistivity of the second oxide layer 5 may be lower than the electrical resistivity of the piezoelectric thin film 6. The electrical resistivity of the second oxide layer 5 may be, for example, $1.0 \times 10^{-5}$ to $1.0 \times 10^{-3} \Omega cm$. When the electrical resistivity of the second oxide layer 5 is $1.0 \times 10^{-3} \Omega cm$ or less, a decrease in the effective applied voltage of the piezoelectric thin film 6 due to the introduction of the first oxide layer 4 is easily suppressed. When the electrical resistivity of the second oxide layer 5 is $1.0 \times 10^{-5} \Omega cm$ or more, the electrical resistivity of the piezoelectric thin film-stacked body 100 becomes higher easily.

The second oxide layer 5 may include an inorganic oxide. The second oxide layer 5 may consist of only an inorganic oxide. When the second oxide layer 5 includes an inorganic oxide, the coefficient of linear expansion of the second oxide layer 5 becomes easily higher than the coefficient of linear expansion of the piezoelectric thin film 6. Stress in a compression direction is easily applied to the piezoelectric thin film 6 by cooling after the second oxide layer 5 is formed at a high temperature. The inorganic oxide included in the second oxide layer 5 may include at least one selected from the group consisting of Ca, Ti, Cr, Mn, Co, Fe, Ni, Sr, Ru, La, Zn, In, Sn, Y, Ba, Cu, and Al. The second oxide layer 5 may include a perovskite-type inorganic oxide. The second oxide layer 5 may consist of only a perovskite-type inorganic oxide. The piezoelectric thin film 6 also includes the perovskite-type inorganic oxide (($K,Na)NbO_3$) when the second oxide layer 5 includes a perovskite-type inorganic oxide, and therefore, the difference in the physical properties or the crystal structure between the second oxide layer 5 and the piezoelectric thin film 6 is reduced. Consequently, even though the piezoelectric thin film-stacked body 100 has been operated continuously, the piezoelectric constant comes to be unlikely to decrease. The perovskite-type inorganic oxide included in the second oxide layer 5 may be, for example, $SrRuO_3$, $SrTiO_3$, $LaNiO_3$, $CaRuO_3$, $BaRuO_3$, $La_{0.5}Sr_{0.5}CoO_3$, $SrRu_{0.95}Mn_{0.05}O_3$, $LaAlO_3$, $YAlO_3$, or the like. The second oxide layer 5 may include at least one perovskite-type inorganic oxide selected from the group consisting of $SrRuO_3$, $CaRuO_3$, $BaRuO_3$, and $LaNiO_3$. In this case, the amount of displacement becomes larger easily. The second oxide layer 5 may include an inorganic oxide that is not a perovskite-type. The second oxide layer 5 may include, for example, $La_4BaCu_5O_{13}$, $YBa_2Cu_3O_7$, or the like as an inorganic oxide that is not a perovskite-type. In the piezoelectric thin film device 103, the composition of the second oxide layer 5a may be the same as the composition of the different second oxide layer 5b, and may be different from the composition of the different second oxide layer 5b.

The thickness $T_2$ of the second oxide layer 5 may be, for example, 5 to 100 nm. When $T_2$ is 5 nm or more, part of the second oxide layer 5 is unlikely to be divided, the second oxide layer 5 easily applies compressive stress to the piezoelectric thin film 6 enough, and the piezoelectric thin film 6 is easily displaced. When $T_2$ is 100 nm or less, the lattice constant of the second oxide layer 5 is unlikely to change, and the crystallinity of the piezoelectric thin film 6 is easily improved. The thickness of the second oxide layer 5a may be the same as the thickness of the different second oxide layer 5b, and may be different from the thickness of the different second oxide layer 5b.

Methods for forming the second oxide layer 5 may be, for example, a sputtering method. When the second oxide layer 5 is formed by a sputtering method, the second oxide layer 5 may be formed in a mixed gas of Ar and $O_2$. A sputtering target may include the above-mentioned inorganic oxide. A sputtering target may include the above-mentioned perovskite-type inorganic oxide. An applying power source may be a high-frequency power source.

The piezoelectric thin film 6 includes perovskite-type $(K,Na)NbO_3$. $(K,Na)NbO_3$ may be called an oxide represented by chemical formula 1. The piezoelectric thin film 6 may consist of only $(K,Na)NbO_3$.

$$(K_{1-x}Na_x)NbO_3 \qquad (1)$$

wherein 0<x<1 in the above chemical formula 1.

The plane direction of the piezoelectric thin film 6 may be oriented preferentially in the thickness direction of the piezoelectric thin film 6. The plane direction oriented preferentially may be any plane direction selected from the group consisting of (001), (110), and (111).

The piezoelectric thin film 6 may further include other elements in addition to $(K,Na)NbO_3$. The other elements may be, for example, Li, Ba, Sr, Ta, Zr, Mn, Sb, Ca, Cu, and the like. At least part of the piezoelectric thin film 6 may be any of a crystal phase having a perovskite structure ($ABO_3$), an amorphous phase, and a mixed phase in which the crystal phase and the amorphous phase are mixed. Here, the A-site of a perovskite structure may be at least one element selected from the group consisting of Li, Na, K, La, Sr, Ba, Ca, Nd, and Bi. The B-site of a perovskite structure may be at least one element selected from the group consisting of Zr, Ti, Mn, Mg, Nb, Sn, Sb, Ta, and In. When the piezoelectric thin film 6 includes other elements, the content of $(K,Na)NbO_3$ in the piezoelectric thin film 6 may be 80 mol % or more.

The thickness $T_P$ of the piezoelectric thin film 6 may be, for example, 0.2 to 5 μm.

Methods for forming the piezoelectric thin film 6 may be, for example, a sputtering method. When the piezoelectric thin film 6 is formed by a sputtering method, the piezoelectric thin film 6 may be formed in a mixed gas of Ar and $O_2$. The gas pressure may be 0.1 to 1.0 Pa. A sputtering target includes $(K,Na)NbO_3$. An applying power source may be a high-frequency power source. The output of an applying power source may be 2.5 to 5.5 W/cm².

The composition of the second electrode layer 7 may be the same as the composition of the first electrode layer 3. The thickness of the second electrode layer 7 may be, for example, 20 to 1000 nm. When the thickness of the second electrode layer 7 is 20 nm or more, the function of the second electrode layer 7 becomes enough easily. When the thickness of the second electrode layer 7 is 1000 nm or less, the displacement characteristics of the piezoelectric thin film 6 are improved easily. The second electrode layer 7 may be a stacked body of a plurality of metals and a conductive metallic oxide used as the above-mentioned first electrode layer 3.

Methods for forming the second electrode layer 7 may be, for example, a sputtering method, a vacuum deposition method, a printing method, a spin coating method, and a sol-gel method. When the second electrode layer 7 is formed by a sputtering method, the second electrode layer 7 may be formed in an Ar gas. The gas pressure may be 0.1 to 1.0 Pa. An applying power source may be a high-frequency power source or a direct-current power source. The output of an applying power source may be 0.5 to 1.0 W/cm².

The piezoelectric thin film devices 102 and 103 may be manufactured in the following procedure. First, a stacked body having the same stacked structure and composition as the piezoelectric thin film-stacked body 100 is formed on a wafer (an uncut substrate 1). Then, the stacked body on a wafer is processed by methods such as photolithography, dry etching, and wet etching to form a pattern having a predetermined size. The size of a pattern may be, for example, 25 mm×5 mm. Additionally, a plurality of piezoelectric thin film devices 102 and 103, which are divided into individual pieces, are obtained by cutting wafers. The substrate 1 may be removed from the piezoelectric thin film devices 102 and 103. In this case, the amount of displacement of the piezoelectric thin film devices 102 and 103 becomes larger easily.

At least part or all of the surface of the piezoelectric thin film devices 102 and 103 may be coated with a protective film. For example, the reliability or the durability (for example, moisture resistance) of the piezoelectric thin film devices 102 and 103 is improved by coating with a protective film. The material of a protective film may be, for example, polyimide or the like.

The piezoelectric thin film devices 102 and 103 may further comprise at least either the input section or the output section for electric signals. In this case, the input or the output of electric signals is enabled, and at least either a positive piezoelectric effect or an inverse piezoelectric effect can be utilized.

The uses of a piezoelectric thin film-stacked body 100, a piezoelectric thin film substrate 101, and piezoelectric thin film devices 102 and 103 are various. The piezoelectric thin film devices 102 and 103 may be used, for example, for a piezoelectric actuator. The piezoelectric characteristics of a piezoelectric actuator according to this embodiment are unlikely to deteriorate even after the piezoelectric actuator has been used continuously for a long period. A piezoelectric actuator may be used, for example, for a head assembly, a head stack assembly, or a hard disk drive. A piezoelectric actuator may be used, for example, for a printer head or an ink-jet printer device. A piezoelectric thin film devices 102 and 103 may be used, for example, for a piezoelectric sensor. Even after a piezoelectric sensor has been used continuously for a long period, the piezoelectric characteristics of the piezoelectric sensor according to this embodiment are unlikely to deteriorate. A piezoelectric sensor may be, for example, a gyro sensor, a pressure sensor, a pulse wave sensor, or a shock sensor. The piezoelectric thin film devices 102 and 103 may be applied, for example, to a microphone.

Specific examples of the uses of the piezoelectric thin film-stacked body 100, the piezoelectric thin film substrate 101, and the piezoelectric thin film devices 102 and 103 are described in detail hereinafter.

(Piezoelectric Actuator)

Figure 2:
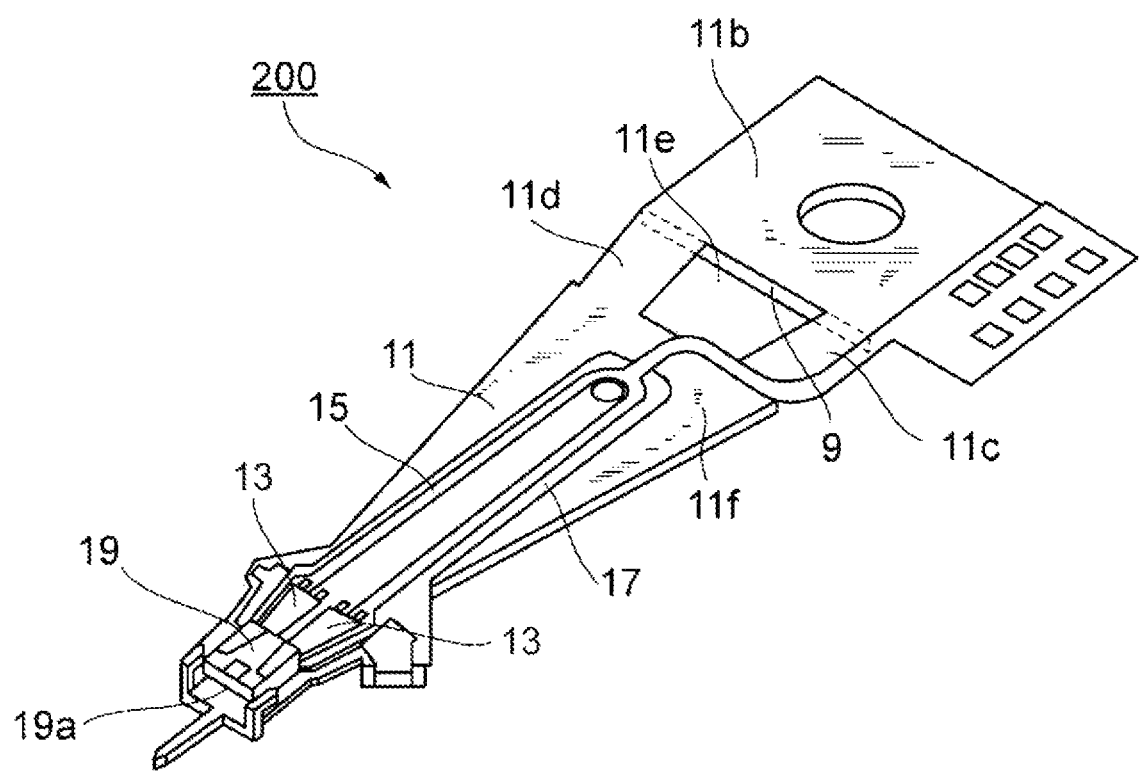
FIG. 2 is a schematic view of a head assembly according to one embodiment of the present invention.

FIG. 2 illustrates a head assembly 200 incorporated by a hard disk drive (HDD). The head assembly 200 comprises a base plate 9, a load beam 11, a flexure 17, first and second piezoelectric thin film devices 13, and a slider 19. The first and second piezoelectric thin film devices 13 are driver devices for the slider 19. The slider 19 has a head device 19a.

The load beam 11 comprises: a base end 11b adhered to the base plate 9; a first flat spring portion 11c and a second flat spring portion 11d extending from this base end 11b; an opening portion 11e formed between the flat spring portions 11c and 11d; and a beam main portion 11f connecting with the flat spring portions 11c and 11d and extending linearly. The first flat spring portion 11c and the second flat spring portion 11d are tapered off. The beam main portion 11f is also tapered off.

The first and second piezoelectric thin film devices 13 are disposed at a predetermined distance on a flexible substrate 15 for wiring, which is a part of the flexure 17. The slider 19 is fixed on the tip of the flexure 17, and is rotated with the expansion and contraction of the first and second piezoelectric thin film devices 13.

Figure 3:
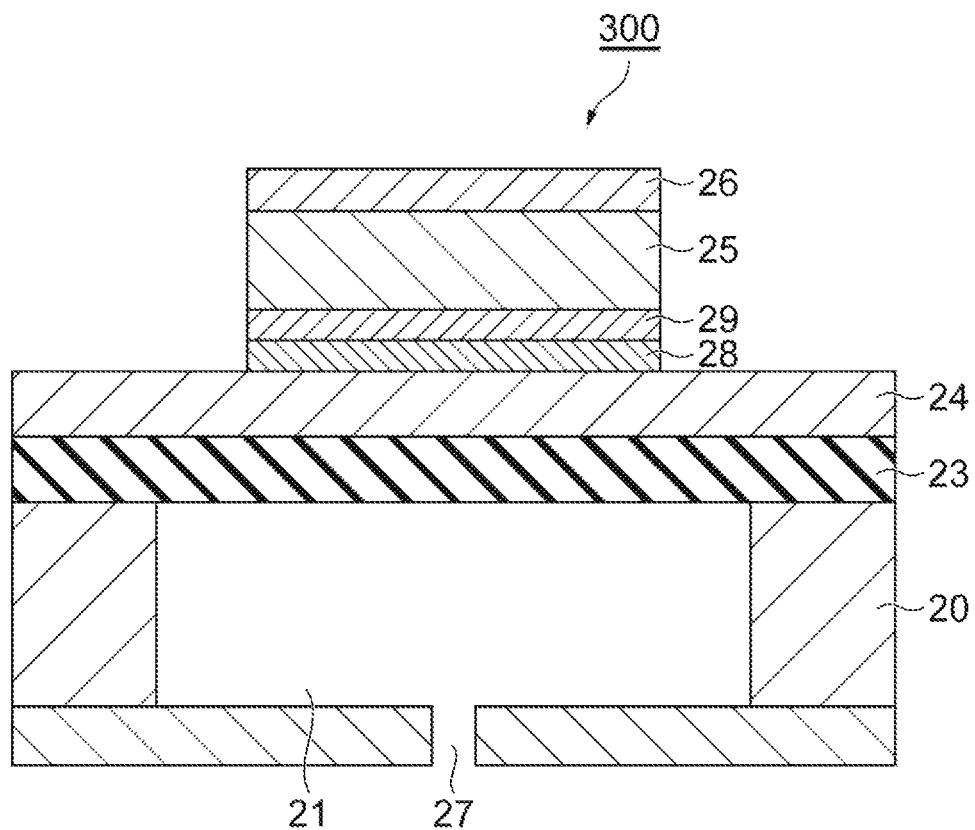
FIG. 3 is a schematic view of a piezoelectric actuator according to one embodiment of the present invention.

FIG. 3 illustrates a piezoelectric actuator 300 for a printer head. The piezoelectric actuator 300 is composed by stacking a base 20, an insulating film 23, a lower electrode layer 24 (first electrode layer), a first oxide layer 28, a second oxide layer 29, a piezoelectric thin film 25, and an upper electrode layer 26 (second electrode layer). The lower electrode layer may be called the above-mentioned first electrode layer. The upper electrode layer may be called the above-mentioned second electrode layer.

When predetermined ejection signals are not supplied and voltage is not applied between the lower electrode layer 24 and the upper electrode layer 26, the piezoelectric thin film 25 does not deform. A pressure change does not occur in a pressure chamber 21 that is adjacent to the piezoelectric thin film 25 to which ejection signals are not supplied, and ink droplets are not ejected from a nozzle 27.

Meanwhile, when predetermined ejection signals are supplied and a constant voltage is applied between the lower electrode layer 24 and the upper electrode layer 26, the piezoelectric thin film 25 deforms. Since the insulating film 23 bends greatly due to the deformation of the piezoelectric thin film 25, the pressure in the pressure chamber 21 increases momentarily, and an ink droplet is ejected from the nozzle 27.

(Piezoelectric Sensor)

Figure 4:
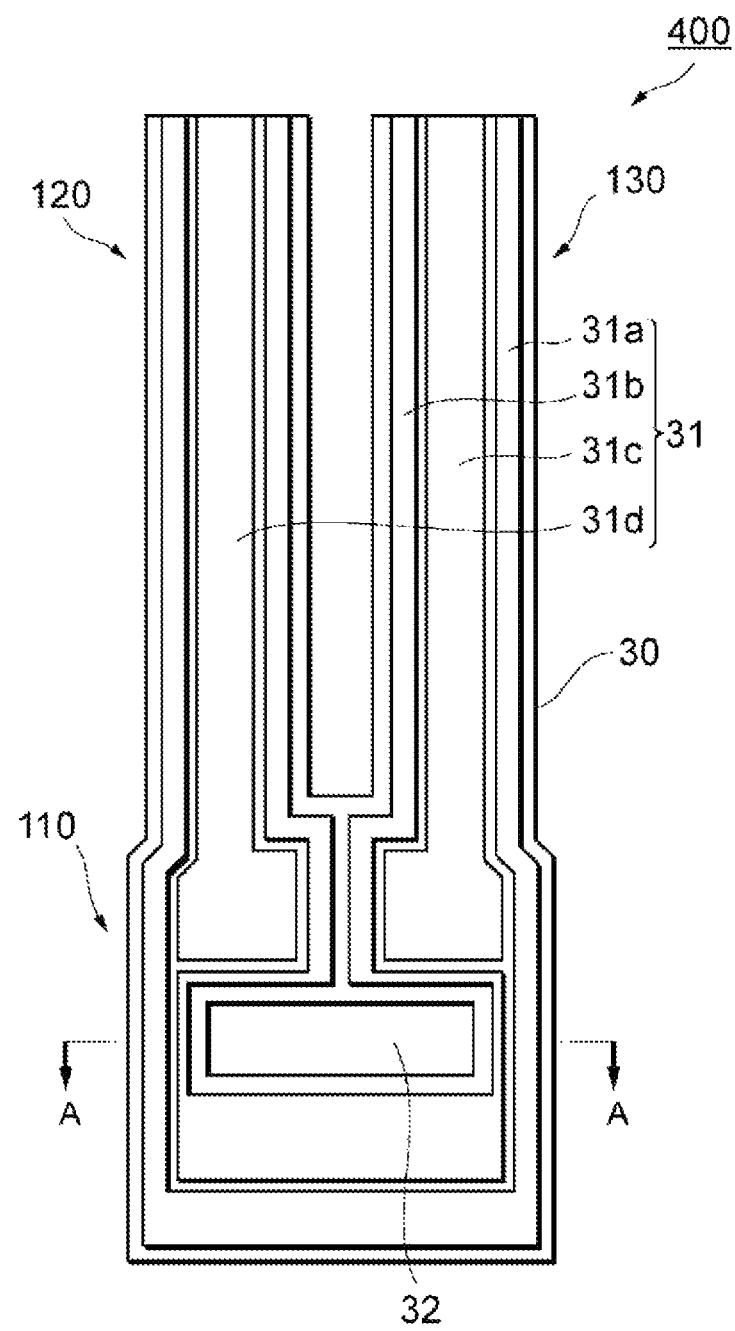
FIG. 4 is a schematic view (a top view) of a gyro sensor according to one embodiment of the present invention.
Figure 5:
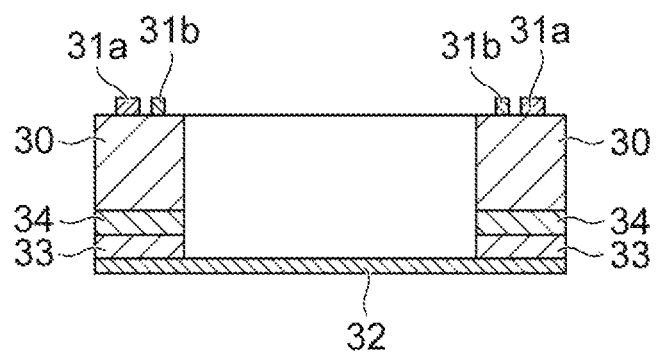
FIG. 5 is a cross section of the gyro sensor, taken from line A-A in FIG. 4.

FIG. 4 and FIG. 5 illustrate a gyro sensor 400, which is a type of piezoelectric sensor. The gyro sensor 400 comprises a basal portion 110 and a pair of arms 120 and 130 connected to a surface of the basal portion 110. The pair of arms 120 and 130 is a tuning fork oscillator. That is, the gyro sensor 400 is a tuning fork oscillator type angular velocity detection device. This gyro sensor 400 is obtained by processing a piezoelectric thin film 30, an upper electrode layer 31 (second electrode layer), a lower electrode layer 32 (first electrode layer), a first oxide layer 33, and a second oxide layer 34 constituting the above-mentioned piezoelectric thin film device into the shape of a tuning fork oscillator. The basal portion 110 and the arms 120 and 130 are integrated with the piezoelectric thin film device. The lower electrode layer may be called the above-mentioned first electrode layer. The upper electrode layer may be called the above-mentioned second electrode layer.

Driving electrode layers 31a and 31b and a sensing electrode layer 31d are formed on the first principal surface of one arm 120. Similarly, the driving electrode layers 31a and 31b and a sensing electrode layer 31c are formed on the first principal surface of the other arm 130. Each of the electrode layers 31a, 31b, 31c, and 31d are obtained by processing the upper electrode layer 31 into the shapes of predetermined electrodes by etching.

The lower electrode layer 32 is formed on the whole of the second principal surface (the rear face of the first principal surface) of each of the basal portion 110 and the arms 120 and 130 respectively. The lower electrode layer 32 functions as a ground electrode of the gyro sensor 400.

An XYZ rectangular coordinate system is defined by specifying that the longitudinal direction of each of the arms 120 and 130 is a Z direction and that a flat surface including the principal surface of the arms 120 and 130 is an XZ flat plane.

When driving signals are supplied to the driving electrode layers 31a and 31b, the two arms 120 and 130 are excited in an in-plane vibration mode. The in-plane vibration mode is a mode in which the two arms 120 and 130 are excited in a direction parallel to the principal surface of the two arms 120 and 130. For example, while one arm 120 is excited at a velocity V1 in a direction of −X, the other arm 130 is excited at a velocity V2 in a direction of +X.

When the rotation at an angular velocity ω having a Z axis as a rotational axis is applied to the gyro sensor 400, Coriolis force acts on each of the arms 120 and 130 in a direction perpendicular to the velocity direction. Consequently, the arms 120 and 130 begin to be excited in an out-of-plane vibration mode. The out-of-plane vibration mode is a mode in which the two arms 120 and 130 are excited in a direction perpendicular to the principal surface of the two arms 120 and 130. For example, when Coriolis force F1 acting on one arm 120 is in a direction of −Y, Coriolis force F2 acting on the other arm 130 is in a direction of +Y.

Since the magnitude of the Coriolis forces F1 and F2 is proportional to the angular velocity ω, the angular velocity ω is determined by converting the mechanical distortion of the arms 120 and 130 by the Coriolis forces F1 and F2 into electric signals (detection signals) by the piezoelectric thin film 30 and extracting the electric signals from the sensing electrode layers 31c and 31d.

Figure 6:
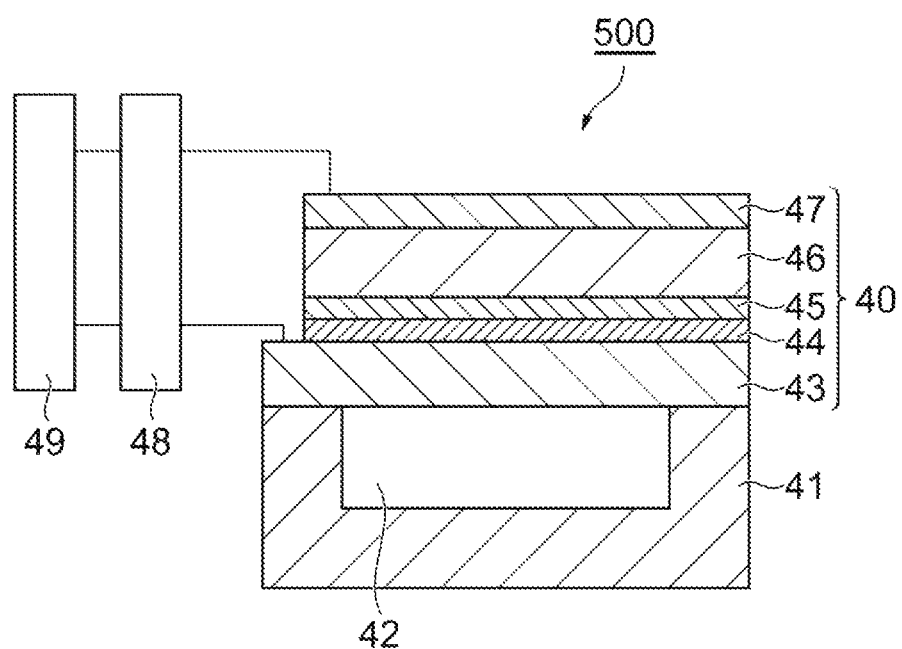
FIG. 6 is a schematic view of a pressure sensor according to one embodiment of the present invention.

FIG. 6 illustrates a pressure sensor 500, which is a type of piezoelectric sensor. The pressure sensor 500 is composed of a piezoelectric thin film device 40, a support 41 supporting the piezoelectric thin film device 40, a current amplifier 48, and a voltage-measuring device 49. The piezoelectric thin film device 40 is composed by stacking a common electrode layer 43 (first electrode layer), a first oxide layer 44, a second oxide layer 45, a piezoelectric thin film 46, and an individual electrode layer 47 (second electrode layer). The common electrode layer may be called the above-mentioned first electrode layer. The individual electrode layer may be called the above-mentioned second electrode layer. A cavity 42 surrounded by the common electrode layer 43 and the support 41 responds according to the pressure. When external force is applied to the pressure sensor 500, the piezoelectric thin film device 40 bends and the voltage is detected in the voltage-measuring device 49.

Figure 7:
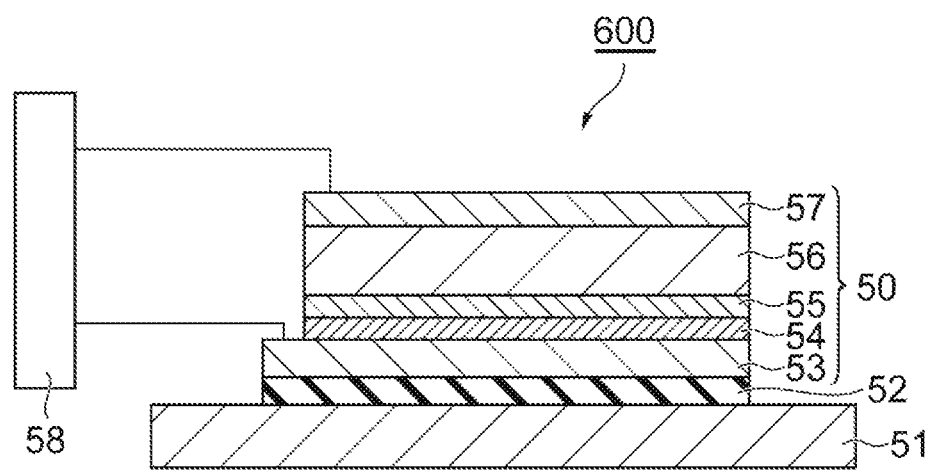
FIG. 7 is a schematic view of a pulse wave sensor according to one embodiment of the present invention.

FIG. 7 illustrates a pulse wave sensor 600, which is a type of piezoelectric sensor. The pulse wave sensor 600 is composed of a support 51, an insulating layer 52 overlapping the support 51, a piezoelectric thin film device 50 overlapping the insulating layer 52, and a voltage-measuring device 58. When the support 51 does not have conductivity, there may not be the insulating layer 52. The piezoelectric thin film device 50 is composed by stacking a common electrode layer 53 (first electrode layer), a first oxide layer 54, a second oxide layer 55, a piezoelectric thin film 56, and an individual electrode layer 57 (second electrode layer). The common electrode layer may be called the above-mentioned first electrode layer. The individual electrode layer may be called the above-mentioned second electrode layer. When the rear face (the face on which the piezoelectric thin film device 50 is not equipped) of the support 51 of the pulse wave sensor 600 is made to contact skin over arteries of a living body, the support 51 and the piezoelectric thin film device 50 are bent by the pressure by pulses of the living body, and the voltage is detected in the voltage-measuring device 58.

(Hard Disk Drive)

Figure 8:
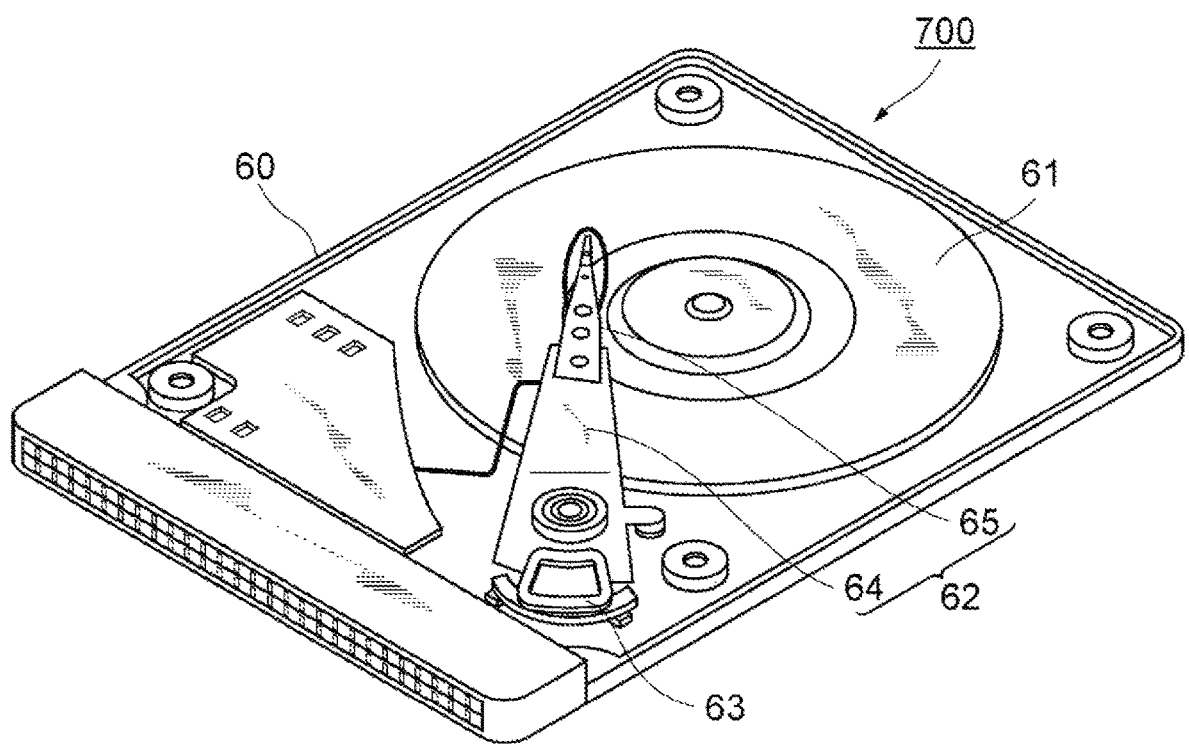
FIG. 8 is a schematic view of a hard disk drive according to one embodiment of the present invention.

FIG. 8 illustrates a hard disk drive 700 incorporating the head assembly illustrated in FIG. 2. A head assembly 65 in FIG. 8 is the same as the head assembly 200 in FIG. 2.

The hard disk drive 700 comprises a case 60, a hard disk 61 (recording medium) installed in the case 60, and a head stack assembly 62. The hard disk 61 is rotated by a motor. The head stack assembly 62 records magnetic information on the hard disk 61 or reproduces magnetic information recorded on the hard disk 61.

The head stack assembly 62 has a voice coil motor 63, an actuator arm 64 supported by a pivot, and the head assembly 65 connected to the actuator arm 64. The actuator arm 64 can rotate freely around the pivot by the voice coil motor 63. The actuator arm 64 is divided into a plurality of arms, and the head assembly 65 is connected to each of the arms respectively. That is, the plurality of arms and head assemblies 65 are stacked in a pivot direction. The slider 19 is attached to the tip of the head assembly 65 so as to be opposed to the hard disk 61.

The head assembly 65 (200) moves the head device 19a in two steps. The relatively larger movement of the head device 19a is controlled by the driving of the whole of the head assembly 65 and the actuator arm 64 by the voice coil motor 63. The micromovement of the head device 19a is controlled by the driving of the slider 19 located on the tip of the head assembly 65.

(Ink-Jet Printer Device)

Figure 9:
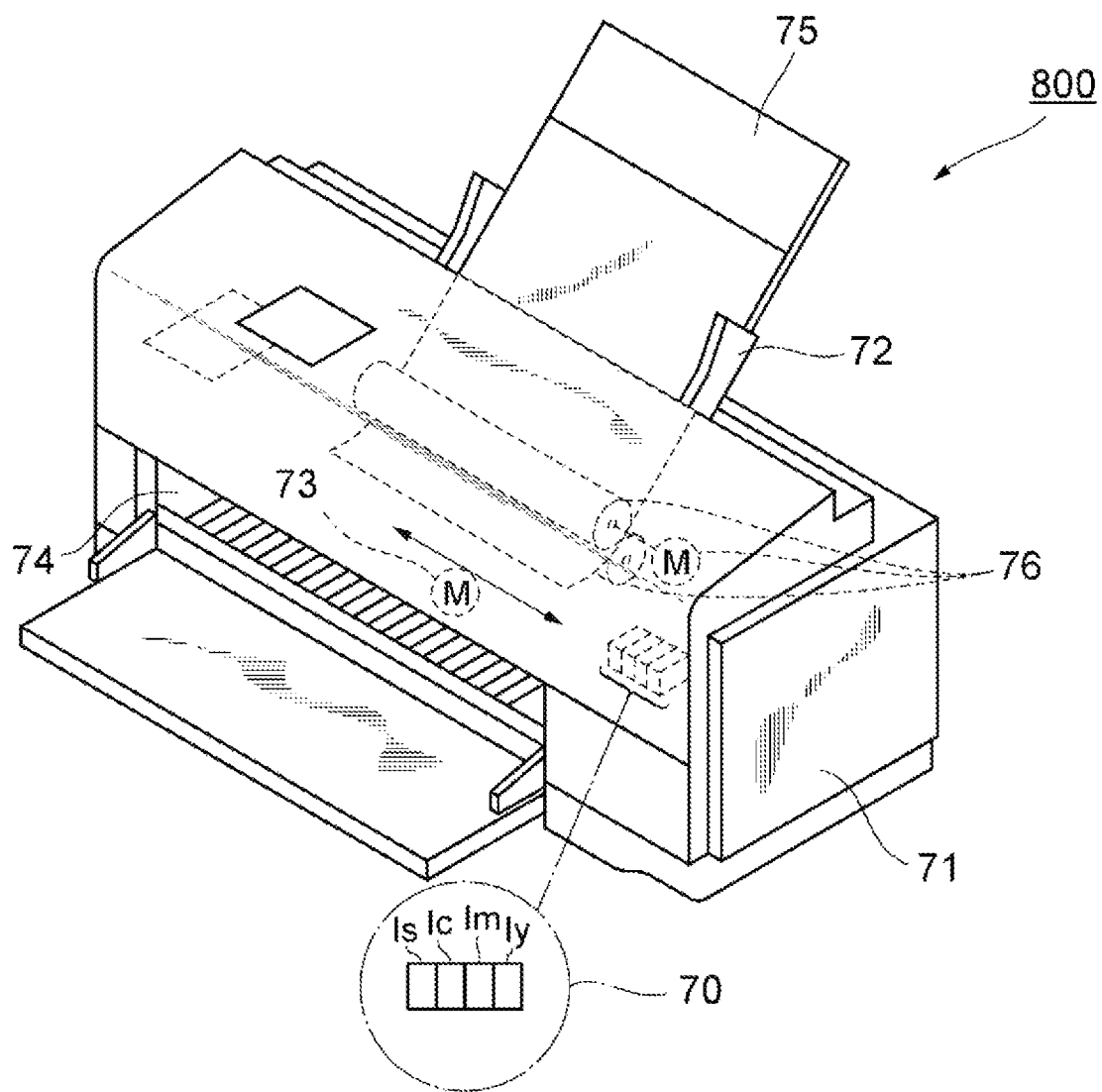
FIG. 9 is a schematic view of an ink-jet printer device according to one embodiment of the present invention.

FIG. 9 illustrates an ink-jet printer device 800. The ink-jet printer device 800 comprises a printer head 70, a main body 71, a tray 72, and a head drive mechanism 73. The printer head 70 in FIG. 9 has the piezoelectric actuator 300 in FIG. 3.

The ink-jet printer device 800 comprises ink cartridges of a total of the 4 colors of yellow, magenta, cyan, and black. Full color printing by the ink-jet printer device 800 is possible. A controller board for exclusive use and the like are incorporated inside the ink-jet printer device 800. The controller board and the like control the timing of the ejection of inks by the printer head 70 and the scanning of the head drive mechanism 73. The tray 72 is disposed on the rear of the main body 71, and an automatic sheet feeder (automatic continuous paper feed mechanism) 76 is disposed on the one end side of the tray 72. The automatic sheet feeder 76 sends out recording paper 75 automatically, and delivers the recording paper 75 from an output opening 74 on the front.

Although preferred embodiments of the present invention are described hereinbefore, the present invention is not limited to the above-mentioned embodiments necessarily. Various modifications of the present invention are possible, and these modifications are also included in the present invention as long as the modifications do not deviate from aims of the present invention.

EXAMPLES

Although the present invention will be described by Examples still more specifically hereinafter, the present invention is not limited to these Examples.

Example 1

A first electrode layer 3 consisting of Pt was formed on the surface of a silicon substrate (uncut substrate 1) in a vacuum chamber. The plane direction of the surface of the silicon substrate on which the first electrode layer 3 was formed was (100). The thickness of the silicon substrate was 400 μm. The first electrode layer 3 was formed by a sputtering method. The temperature of the silicon substrate in the process of formation of the first electrode layer 3 was maintained at 400° C. The thickness of the first electrode layer 3 was adjusted to 200 nm.

A first oxide layer 4 including K, Na, Nb, and O was formed on the surface of the first electrode layer 3 in a vacuum chamber. The first oxide layer 4 was formed by a sputtering method. The temperature of the silicon substrate in the process of formation of the first oxide layer 4 was maintained at 550° C. A mixed gas of Ar and $O_2$ was used as an atmosphere in the vacuum chamber. The concentration of $O_2$ in the mixed gas was 5% by volume on the basis of the total volume of the mixed gas. The gas pressure of mixed gas was maintained at 0.2 Pa. $(K_{0.5}Na_{0.5})NbO_3$ was used as a sputtering target. The size of the sputtering target is φ150 mm. A high-frequency power source was used as an applying power source for sputtering. The applied output was adjusted to 800 W. The thickness of the first oxide layer 4 was adjusted to 15 nm.

A second oxide layer 5 consisting of $SrRuO_3$ was formed on the surface of the first oxide layer 4 in a vacuum chamber. The second oxide layer 5 was formed by a sputtering method. The temperature of the silicon substrate in the process of formation of the second oxide layer 5 was maintained at 600° C. A mixed gas of Ar and $O_2$ was used as an atmosphere in the vacuum chamber. The concentration of $O_2$ in the mixed gas was 2.5% by volume on the basis of the total volume of the mixed gas. The gas pressure of the mixed gas was maintained at 0.2 Pa. The size of a sputtering target was φ150 mm. A high-frequency power source was used as the applying power source for sputtering. The applied output was adjusted to 150 W. The thickness of the second oxide layer 5 was adjusted to 15 nm.

A piezoelectric thin film 6 consisting of $(K,Na)NbO_3$ was formed on the surface of the second oxide layer 5 in a vacuum chamber. The piezoelectric thin film 6 was formed by a sputtering method. The temperature of the silicon substrate in the process of formation of the piezoelectric thin film 6 was maintained at 550° C. A mixed gas of Ar and $O_2$ was used as an atmosphere in the vacuum chamber. The concentration of $O_2$ in the mixed gas was 5% by volume on the basis of the total volume of the mixed gas. $(K_{0.5}Na_{0.5})NbO_3$ was used as a sputtering target. The size of the sputtering target was φ150 mm. A high-frequency power source was used as an applying power source for sputtering. The applied output was adjusted to 800 W. The thickness of the piezoelectric thin film 6 was adjusted to 2 μm. A piezoelectric thin film substrate 111 in Example 1 was obtained by the above method.

A second electrode layer 7 consisting of Pt was formed on the surface of the piezoelectric thin film 6 included in the piezoelectric thin film substrate 111 in a vacuum chamber. The second electrode layer 7 was formed by a sputtering method. The temperature in the vacuum chamber was maintained at room temperature. The thickness of the second electrode layer 7 was adjusted to 200 nm.

Figure 10:
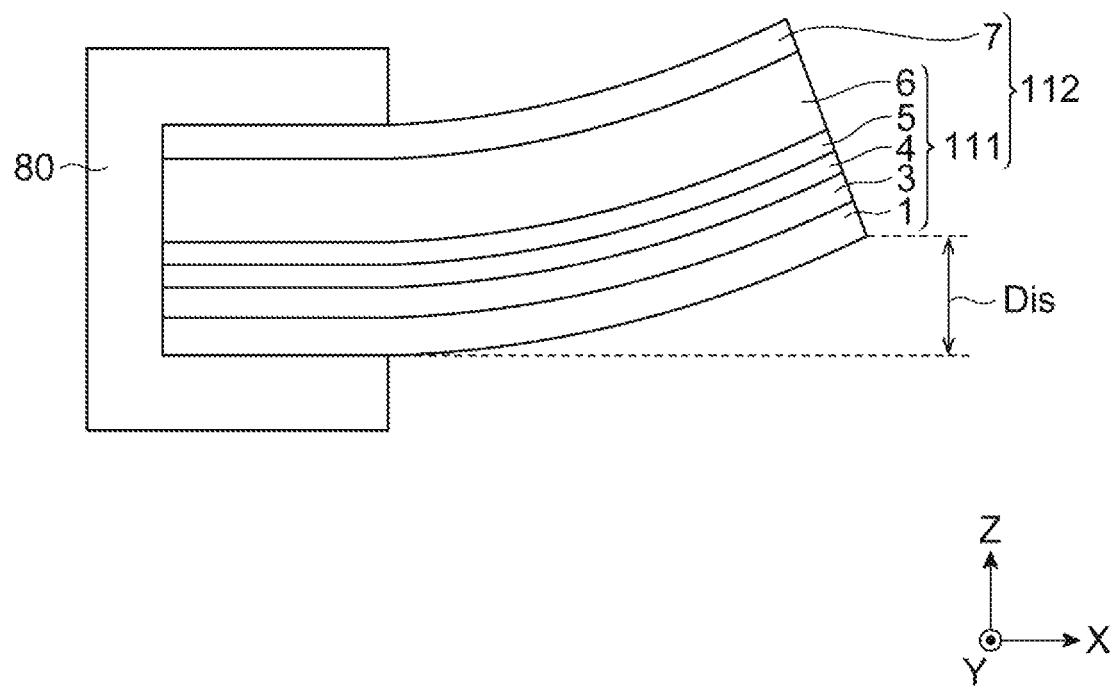
FIG. 10 is a schematic view illustrating a method for measuring the amount of displacement of a piezoelectric thin film device.

The patterning of the second electrode layer 7, the piezoelectric thin film 6, the second oxide layer 5, the first oxide layer 4, and the first electrode layer 3 was performed by photolithography, dry etching, and wet etching. Then, the silicon substrate was cut. A piezoelectric thin film device 112 in Example 1 was obtained by the above method. As illustrated in FIG. 10, the piezoelectric thin film device 112 in Example 1 was composed of a substrate 1, a first electrode layer 3 overlapping the substrate 1, a first oxide layer 4 overlapping the first electrode layer 3, a second oxide layer 5 overlapping the first oxide layer 4, a piezoelectric thin film 6 overlapping the second oxide layer 5, and a second electrode layer 7 overlapping the piezoelectric thin film 6. The size of the movable portion of the piezoelectric thin film device 112 in Example 1 was 25 mm×5 mm.

[Measurement of Electrical Resistivity]

Direct current voltage was applied between the first electrode layer 3 and the second electrode layer 7 in the piezoelectric thin film device 112 in Example 1, and the electrical resistivity between the first electrode layer 3 and the second electrode layer 7 was measured. The direct current voltage was 40 kV/cm. The time for which the direct current voltage was applied was 30 seconds. The electrical resistivity of the piezoelectric thin film device 112 in Example 1 is illustrated in Table 1.

By the following method, each of samples for the measurement of the electrical resistivity were manufactured, and the respective electrical resistivities of the first oxide layer 4 and the second oxide layer 5 in Example 1 were measured separately.

The first electrode layer 3 was formed directly on the surface of the silicon substrate by the same method as above. The first oxide layer 4 was formed directly on the surface of the first electrode layer 3 by the same method as above. The second electrode layer 7 was formed directly on the surface of the first oxide layer 4 by the same method as above. The patterning of the second electrode layer 7, the first oxide layer 4, and the first electrode layer 3 was performed by the same method as above. The silicon substrate was cut to obtain samples. The size of the samples was 25 mm×5 mm. The electrical resistivity of the first oxide layer 4 was measured by using this sample by the same method as above. The electrical resistivity of the first oxide layer 4 in Example 1 was $1.0 \times 10^{12}$ Ωcm or more.

The first electrode layer 3 was formed directly on the surface of the silicon substrate by the same method as above. The second oxide layer 5 was formed directly on the surface of the first electrode layer 3 by the same method as above. The second electrode layer 7 was formed directly on the surface of the second oxide layer 5 by the same method as above. The patterning of the second electrode layer 7, the second oxide layer 5, and the first electrode layer 3 was performed by the same method as above. The silicon substrate was cut to obtain samples. The size of the samples was 25 mm×5 mm. The electrical resistivity of the second oxide layer 5 was measured by using this sample by the same method as above. The electrical resistivity of the second oxide layer 5 in Example 1 was $1.0 \times 10^{-3}$ Ωcm or less.

[Measurement of Rate of Change of Piezoelectric Constant]

(1) Calculation of Initial Value of Piezoelectric Constant

The amount of displacement $Dis_{25° C.}$ (unit: nm) at 25° C. of the piezoelectric thin film device 112 in Example 1 was measured by the following method. As illustrated in FIG. 10, when an end of the piezoelectric thin film device 112 is fixed by a clamp 80 and voltage is applied between the first electrode layer 3 and the second electrode layer 7, the amount of displacement means the distance (amount of displacement Dis) through which the tip on an unfixed side of the piezoelectric thin film device 112 moves in a thickness direction (stacking direction, Z direction) of the piezoelectric thin film device 112 with the deformation of the piezoelectric thin film device 112. The frequency of alternating current voltage applied between the first electrode layer 3 and the second electrode layer 7 was 100 Hz. The alternating current voltage was 0 to 40 kV/cm and had a sine wave form. The $Dis_{25° C.}$ in Example 1 was measured by using a laser Doppler vibrometer and an oscilloscope. Then, the initial value $(-d_{31A})$ of the piezoelectric constant $(-d_{31})$ of the piezoelectric thin film device 112 in Example 1 was calculated. $d_{31}$ is calculated on the basis of expression A. In expression A, $h_s$ is the thickness of the substrate 1. L is the length of the movable portion of the piezoelectric thin film 6. $S_{11,p}$ is the elastic modulus of the piezoelectric thin film 6. $S_{11,s}$ is the elastic modulus of the substrate 1. V is applied voltage.

[Expression 1]

$$d_{31} \cong -\frac{h_s^2}{3L^2} \frac{s_{11,p}}{s_{11,s}} \frac{Dis}{V} \quad (A)$$

(2) Continuous Operation Test

A continuation operation test in which the piezoelectric thin film device 112 in Example 1 was used was performed by the following method. As illustrated in FIG. 10, an end of the piezoelectric thin film device 112 was fixed by the clamp 80. Alternating current voltage was applied between the first electrode layer 3 and the second electrode layer 7 1200 million times. The frequency of the alternating current voltage was 100 Hz. The alternating current voltage was 0 to 40 kV/cm and had a sine wave form. The piezoelectric constant $(-d_{31B})$ of the piezoelectric thin film device 112 after the application of alternating current voltage 1200 million times was calculated by the same method as above. The rate of change $\Delta(-d_{31})$ (unit: %) of the piezoelectric constant in Example 1 was calculated on the basis of expression B. The $\Delta(-d_{31})$ in Example 1 is illustrated in Table 1.

$$\Delta(-d_{31}) = \{(-d_{31B}) - (-d_{31A})\}/(-d_{31A}) \times 100 \quad (B)$$

Example 2

A piezoelectric thin film substrate 111 in Example 2 was manufactured by the same method as Example 1. A different second oxide layer 5b consisting of $SrRuO_3$ was formed on the surface of the piezoelectric thin film 6 included in the piezoelectric thin film substrate 111 in a vacuum chamber. The different second oxide layer 5b was formed by a sputtering method. The temperature of the silicon substrate in the process of formation of the different second oxide layer 5b was maintained at 600° C. A mixed gas of Ar and $O_2$ was used as an atmosphere in the vacuum chamber. The concentration of $O_2$ in the mixed gas was 2.5% by volume on the basis of the total volume of the mixed gas. The gas pressure of the mixed gas was maintained at 0.2 Pa. The size of the sputtering target was φ150 mm. A high-frequency power source was used as an applying power source for sputtering. The applied output was adjusted to 150 W. The thickness of the different second oxide layer 5b was adjusted to 15 nm.

A different first oxide layer 4b including K, Na, Nb, and O was formed on the surface of the different second oxide layer 5b in a vacuum chamber. The different first oxide layer 4b was formed by a sputtering method. The temperature of the silicon substrate in the process of formation of the different first oxide layer 4b was maintained at 550° C. A mixed gas of Ar and $O_2$ was used as an atmosphere in the vacuum chamber. The concentration of $O_2$ in the mixed gas was 5% by volume on the basis of the total volume of the mixed gas. The gas pressure of the mixed gas was maintained at 0.2 Pa. $(K_{0.5}Na_{0.5})NbO_3$ was used as a sputtering target. The size of the sputtering target was φ150 mm. A high-frequency power source was used as an applying power source for sputtering. The applied output was adjusted to 800 W. The thickness of the different first oxide layer 4b was adjusted to 15 nm.

A second electrode layer 7 consisting of Pt was formed on the surface of the different first oxide layer 4b in a vacuum chamber. The second electrode layer 7 was formed by a sputtering method. The temperature in the vacuum chamber was maintained at room temperature. The thickness of the second electrode layer 7 was adjusted to 200 nm.

The patterning of the second electrode layer 7, the different first oxide layer 4b, the different second oxide layer 5b, the piezoelectric thin film 6, the second oxide layer 5 (5a), the first oxide layer 4 (4a), and the first electrode layer 3 was performed by photolithography, dry etching, and wet etching. Then, the silicon substrate was cut. A piezoelectric thin film device 103 in Example 2 was obtained by the above method. As illustrated in FIG. 1D, the piezoelectric thin film device 103 in Example 2 was composed of a substrate 1, a first electrode layer 3 overlapping the substrate 1, a first oxide layer 4a overlapping the first electrode layer 3, a second oxide layer 5a overlapping the first oxide layer 4a, a piezoelectric thin film 6 overlapping the second oxide layer 5a, a different second oxide layer 5b overlapping the piezoelectric thin film 6, a different first oxide layer 4b overlapping the different second oxide layer 5b, and a second electrode layer 7 overlapping the different first oxide layer 4b. The size of the movable portion of the piezoelectric thin film device 103 in Example 2 was 25 mm×5 mm.

The electrical resistivity of the piezoelectric thin film device 103 in Example 2 was measured by the same method as Example 1. The electrical resistivity of the piezoelectric thin film device 103 in Example 2 is illustrated in Table 1. Since the first oxide layer 4 in Example 2 is the same as the first oxide layer 4 in Example 1, the electrical resistivity of the first oxide layer 4 in Example 2 is equal to the electrical resistivity of the first oxide layer 4 in Example 1. Since the second oxide layer 5 in Example 2 is the same as the second oxide layer 5 in Example 1, the electrical resistivity of the second oxide layer 5 in Example 2 is equal to the electrical resistivity of the second oxide layer 5 in Example 1.

$\Delta(-d_{31})$ in Example 2 was calculated by the same method as Example 1. The $\Delta(-d_{31})$ in Example 2 is illustrated in Table 1.

Example 3

In the process of formation of a second oxide layer 5 in Example 3, a sputtering target consisting of ZnO was used instead of the sputtering target used in the process of formation of the second oxide layer 5 in Example 1. Consequently, in Example 3, the second oxide layer 5 consisting of ZnO was formed in Example 3. A piezoelectric thin film device 112 in Example 3 was manufactured by the same method as Example 1 except the above point. As illustrated in FIG. 10, the piezoelectric thin film device 112 in Example 3 was composed of a substrate 1, a first electrode layer 3 overlapping the substrate 1, a first oxide layer 4 overlapping the first electrode layer 3, a second oxide layer 5 overlapping the first oxide layer 4, a piezoelectric thin film 6 overlapping the second oxide layer 5, and a second electrode layer 7 overlapping the piezoelectric thin film 6.

The electrical resistivity of the piezoelectric thin film device 112 in Example 3 was measured by the same method as Example 1. The electrical resistivity of the piezoelectric thin film device 112 in Example 3 is illustrated in Table 1. The electrical resistivity of the second oxide layer 5 in Example 3 was measured by the same method as Example 1. The electrical resistivity of the second oxide layer 5 in Example 3 was $1.0 \times 10^{-3}$ Ωcm or less. Since the first oxide layer 4 in Example 3 is the same as the first oxide layer 4 in Example 1, the electrical resistivity of the first oxide layer 4 in Example 3 is equal to the electrical resistivity of the first oxide layer 4 in Example 1.

$\Delta(-d_{31})$ in Example 3 was calculated by the same method as Example 1. The $\Delta(-d_{31})$ in Example 3 is illustrated in Table 1.

Example 4

In the process of formation of a second oxide layer 5 in Example 4, a sputtering target consisting of $LaNiO_3$ was used instead of the sputtering target used in the process of formation of the second oxide layer 5 in Example 1. Consequently, in Example 4, the second oxide layer 5 consisting of $LaNiO_3$ was formed. A piezoelectric thin film device 112 in Example 4 was manufactured by the same method as Example 1 except the above point. As illustrated in FIG. 10, the piezoelectric thin film device 112 in Example 4 was composed of a substrate 1, a first electrode layer 3 overlapping the substrate 1, a first oxide layer 4 overlapping the first electrode layer 3, a second oxide layer 5 overlapping the first oxide layer 4, a piezoelectric thin film 6 overlapping the second oxide layer 5, and a second electrode layer 7 overlapping the piezoelectric thin film 6.

The electrical resistivity of the piezoelectric thin film device 112 in Example 4 was measured by the same method as Example 1. The electrical resistivity of the piezoelectric thin film device 112 in Example 4 is illustrated in Table 1. The electrical resistivity of the second oxide layer 5 in Example 4 was measured by the same method as Example 1. The electrical resistivity of the second oxide layer 5 in Example 4 was $1.0 \times 10^{-3}$ Ωcm or less. Since the first oxide layer 4 in Example 4 is the same as the first oxide layer 4 in Example 1, the electrical resistivity of the first oxide layer 4 in Example 4 is equal to the electrical resistivity of the first oxide layer 4 in Example 1.

$\Delta(-d_{31})$ in Example 4 was calculated by the same method as Example 1. The $\Delta(-d_{31})$ in Example 4 is illustrated in Table 1.

Comparative Example 1

In Comparative Example 1, a first oxide layer 4 and a second oxide layer 5 were not formed. That is, in Comparative Example 1, a piezoelectric thin film 6 was formed directly on the surface of a first electrode layer 3. A piezoelectric thin film device in Comparative Example 1 was manufactured by the same method as Example 1 except the above point. The piezoelectric thin film device in Comparative Example 1 was composed of a substrate 1, a first electrode layer 3 overlapping the substrate 1, a piezoelectric thin film 6 overlapping the first electrode layer 3, and a second electrode layer 7 overlapping the piezoelectric thin film 6.

The electrical resistivity of the piezoelectric thin film device in Comparative Example 1 was measured by the same method as Example 1. The electrical resistivity of the piezoelectric thin film device in Comparative Example 1 is illustrated in Table 1.

$\Delta(-d_{31})$ in Comparative Example 1 was calculated by the same method as Example 1. The $\Delta(-d_{31})$ in Comparative Example 1 is illustrated in Table 1.

Comparative Example 2

A first oxide layer 4 was not formed in Comparative Example 2. That is, in Comparative Example 2, a second oxide layer 5 was formed directly on the surface of a first electrode layer 3. A piezoelectric thin film device in Comparative Example 2 was manufactured by the same method as Example 1 except the above point. The piezoelectric thin film device in Comparative Example 2 was composed of a substrate 1, a first electrode layer 3 overlapping the substrate 1, a second oxide layer 5 overlapping the first electrode layer 3, a piezoelectric thin film 6 overlapping the second oxide layer 5, and a second electrode layer 7 overlapping the piezoelectric thin film 6.

The electrical resistivity of the piezoelectric thin film device in Comparative Example 2 was measured by the same method as Example 1. The electrical resistivity of the piezoelectric thin film device in Comparative Example 2 is illustrated in Table 1. Since the second oxide layer 5 in Comparative Example 2 is the same as the second oxide layer 5 in Example 1, the electrical resistivity of the second oxide layer 5 in Comparative Example 2 is equal to the electrical resistivity of the second oxide layer 5 in Example 1.

$\Delta(-d_{31})$ in Comparative Example 2 was calculated by the same method as Example 1. The $\Delta(-d_{31})$ in Comparative Example 2 is illustrated in Table 1.

2 was lower than the electrical resistivity in Comparative Example 1, and the absolute value of the $\Delta(-d_{31})$ in Comparative Example 2 was larger than the absolute value of the $\Delta(-d_{31})$ in Comparative Example 1. The electrical resistivity of the piezoelectric thin film device in Example 1 comprising a first oxide layer 4 and a second oxide layer 5 was higher than the electrical resistivity of the piezoelectric thin film devices in each of Comparative Examples 1 and 2 that are lacking in at least either the first oxide layer 4 or the second oxide layer 5. The absolute value of the $\Delta(-d_{31})$ in Example 1 was smaller than the absolute values of the $\Delta(-d_{31})$s in each of Comparative Examples 1 and 2.

Though there is a moderate resistance effect in the case of Example 1, a sufficient electric field can be applied on a piezoelectric thin film 6. Consequently, it is considered that the absolute value of the $\Delta(-d_{31})$ in Example 1 was smaller than the absolute values of the $\Delta(-d_{31})$s in each of Comparative Examples 1 and 2.

The piezoelectric thin film device in Comparative Example 1 does not comprise a first oxide layer 4 and a second oxide layer 5. Therefore, in Comparative Example 1, electric and mechanical loads are applied directly to a piezoelectric thin film 6. Consequently, it is considered that the absolute value of the $\Delta(-d_{31})$ in Comparative Example 1 was larger than the absolute value of the $\Delta(-d_{31})$ in Example 1.

The piezoelectric thin film device in Comparative Example 2 does not comprise a first oxide layer 4. Therefore, high electrical resistivity could not be secured, and additionally, the adhesion on the interface between the second oxide layer 5 and the piezoelectric thin film 6 increased in Comparative Example 2. Consequently, it is considered that the electric and mechanical loads applied to the piezoelectric thin film 6 in Comparative Example 2 becomes larger than that in Comparative Example 1, and the absolute value of the $\Delta(-d_{31})$ in Comparative Example 2 was larger than the absolute value of the $\Delta(-d_{31})$ in Comparative Example 1.

Though there is a moderate resistance effect in the case of Example 2 similarly to Example 1, a sufficient electric field can be applied on the piezoelectric thin film 6. Consequently, it is considered that the absolute value of the $\Delta(-d_{31})$ in

TABLE 1

| | First electrode layer side | | | | Second electrode layer side | | | | | Continuous operation test $\Delta(-d31)$ (%) |
|---|---|---|---|---|---|---|---|---|---|---|
| | First oxide layer 4 (4a) | | Second oxide layer 5 (5a) | | First oxide layer 4b | | Second oxide layer 5b | | Electrical | |
| | Sputtering target | Thickness (nm) | Sputtering target | Thickness (nm) | Sputtering target | Thickness (nm) | Sputtering target | Thickness (nm) | resistivity ($\Omega$cm) | |
| Example 1 | $(K_{0.5}Na_{0.5})NbO_3$ | 15 | $SrRuO_3$ | 15 | — | — | — | — | $6.30 \times 10^{13}$ | −1.2 |
| Example 2 | $(K_{0.5}Na_{0.5})NbO_3$ | 15 | $SrRuO_3$ | 15 | $(K_{0.5}Na_{0.5})NbO_3$ | 15 | $SrRuO_3$ | 15 | $3.40 \times 10^{13}$ | −1.5 |
| Example 3 | $(K_{0.5}Na_{0.5})NbO_3$ | 15 | ZnO | 15 | — | — | — | — | $9.80 \times 10^{11}$ | −1.8 |
| Example 4 | $(K_{0.5}Na_{0.5})NbO_3$ | 15 | $LaNiO_3$ | 15 | — | — | — | — | $2.60 \times 10^{12}$ | −1.6 |
| Comparative Example 1 | — | — | — | — | — | — | — | — | $6.50 \times 10^{10}$ | −3.6 |
| Comparative Example 2 | — | — | $SrRuO_3$ | 15 | — | — | — | — | $7.40 \times 10^{9}$ | −4.5 |

Comparative Example 1 and Comparative Example 2 will be compared. The piezoelectric thin film device in Comparative Example 1 does not comprise a first oxide layer 4 and a second oxide layer 5. Meanwhile, the piezoelectric thin film device in Comparative Example 2 comprises a second oxide layer 5. Due to such a difference in the stacked structure, the electrical resistivity in Comparative Example 2 was smaller than the absolute values of the $\Delta(-d_{31})$s in each of Comparative Examples 1 and 2.

Though there is a moderate resistance effect in the cases of Examples 3 and 4 similarly to Example 1, a sufficient electric field can be applied on the piezoelectric thin film 6. Consequently, it is considered that the absolute values of the Δ(-d$_{31}$)s in Examples 3 and 4 were smaller than the absolute values of the Δ(-d$_{31}$)s in each of Comparative Examples 1 and 2.

As Examples 1, 3, and 4 indicate, the absolute values of the Δ(-d$_{31}$)s in each of Examples 1, 3, and 4 were smaller than the absolute values of the Δ(-d$_{31}$)s in each of Comparative Examples 1 and 2, not depending on the difference in the composition of the second oxide layers 5.

INDUSTRIAL APPLICABILITY

The present invention provides a piezoelectric thin film-stacked body the electrical resistivity of which is high and the piezoelectric constants of which are unlikely to decrease in spite of a continuous operation, a piezoelectric thin film substrate, and a piezoelectric thin film device as well as a piezoelectric actuator using the piezoelectric thin film device, a piezoelectric sensor, a head assembly, a head stack assembly, a hard disk drive, a printer head, and an ink-jet printer device.

REFERENCE SIGNS LIST

100: piezoelectric thin film-stacked body; 101: piezoelectric thin film substrate; 102 and 103: piezoelectric thin film devices; 1: substrate; 2: insulating layer; 3: first electrode layer; 4, 4a, and 4b: first oxide layer; 5, 5a, and 5b: second oxide layer; 6: piezoelectric thin film; 7: second electrode layer; 200: head assembly; 9: base plate; 11: load beam; 11b: base end; 11c: first flat spring portion; 11d: second flat spring portion; 11e: opening portion; 11f: beam main portion; 13: piezoelectric thin film devices; 15: flexible substrate; 17: flexure; 19: slider; 19a: head device; 300: piezoelectric actuator; 20: base; 21: pressure chamber; 23: insulating film; 24: lower electrode layer (first electrode layer); 25: piezoelectric thin film; 26: upper electrode layer (second electrode layer); 27: nozzle; 28: first oxide layer; 29: second oxide layer; 400: gyro sensor; 110: basal portion; 120 and 130: arms; 30: piezoelectric thin film; 31: upper electrode layer (second electrode layer); 31a and 31b: driving electrode layers; 31c and 31d: sensing electrode layers; 32: lower electrode layer (first electrode layer); 33: first oxide layer; 34: second oxide layer; 500: pressure sensor; 40: piezoelectric thin film device; 41: support; 42: cavity; 43: common electrode layer (first electrode layer); 44: first oxide layer; 45: second oxide layer; 46: piezoelectric thin film; 47: individual electrode layer (second electrode layer); 48: current amplifier; 49: voltage-measuring device; 600: pulse wave sensor; 50: piezoelectric thin film device; 51: support; 52: insulating layer; 53: common electrode layer (first electrode layer); 54: first oxide layer; 55: second oxide layer; 56: piezoelectric thin film; 57: individual electrode layer (second electrode layer); 58: voltage-measuring device; 700: hard disk drive; 60: case; 61: hard disk; 62: head stack assembly; 63: voice coil motor; 64: actuator arm; 65: head assembly; 800: ink-jet printer device; 70: printer head; 71: main body; 72: tray; 73: head drive mechanism; 74: output opening; 75: recording paper; 76: automatic sheet feeder (automatic continuous paper feed mechanism); 111: piezoelectric thin film substrate; 112: piezoelectric thin film device; 80: clamp.

What is claimed is:

1. A piezoelectric thin film-stacked body, comprising:
a first electrode layer;
a first oxide layer stacked on the first electrode layer;
a second oxide layer stacked on the first oxide layer; and
a piezoelectric thin film stacked on the second oxide layer,
wherein an electrical resistivity of the first oxide layer is higher than an electrical resistivity of the second oxide layer,
the first oxide layer includes K, Na and Nb, and
the piezoelectric thin film includes $(K,Na)NbO_3$.

2. The piezoelectric thin film-stacked body according to claim 1,
wherein an electrical resistivity of the piezoelectric thin film-stacked body is $1.0 \times 10^{11}$ to $1.0 \times 10^{14} \Omega cm$.

3. The piezoelectric thin film-stacked body according to claim 1,
wherein a ratio $T_1/T_P$ of a thickness $T_1$ of the first oxide layer to a thickness $T_P$ of the piezoelectric thin film is 0.0010 to 0.0150.

4. A piezoelectric thin film substrate, including:
the piezoelectric thin film-stacked body according to claims 1; and
a substrate,
wherein the first electrode layer is located between the substrate and the first oxide layer.

5. A piezoelectric thin film device, including:
the piezoelectric thin film-stacked body according to claims 1; and
a second electrode layer,
wherein the first oxide layer, the second oxide layer, and the piezoelectric thin film are located between the first electrode layer and the second electrode layer.

6. A piezoelectric actuator, comprising:
the piezoelectric thin film device according to claim 5.

7. A piezoelectric sensor, comprising:
the piezoelectric thin film device according to claim 5.

8. A head assembly, comprising:
the piezoelectric actuator according to claim 6.

9. A head stack assembly, comprising:
the head assembly according to claim 8.

10. A hard disk drive, comprising:
the head stack assembly according to claim 9.

11. A printer head, comprising:
the piezoelectric actuator according to claim 6.

12. An ink-jet printer device, comprising:
the printer head according to claim 11.

* * * * *